(12) United States Patent
Seo et al.

(10) Patent No.: US 8,779,429 B2
(45) Date of Patent: Jul. 15, 2014

(54) DISPLAY SUBSTRATE AND METHOD OF MANUFACTURING THE SAME

(75) Inventors: O-Sung Seo, Seoul (KR); Hwa-Yeul Oh, Asan-si (KR); Hyoung-Cheol Lee, Suwon-si (KR); Tae-Kyung Yim, Seoul (KR)

(73) Assignee: Samsung Display Co., Ltd. (KR)

( * ) Notice: Subject to any disclaimer, the term of this patent is extended or adjusted under 35 U.S.C. 154(b) by 182 days.

(21) Appl. No.: 13/565,639

(22) Filed: Aug. 2, 2012

(65) Prior Publication Data

US 2013/0234144 A1    Sep. 12, 2013

(30) Foreign Application Priority Data

Mar. 7, 2012  (KR) .................. 10-2012-0023585

(51) Int. Cl.
*H01L 27/14*    (2006.01)
*H01L 21/84*    (2006.01)

(52) U.S. Cl.
USPC ............. 257/59; 257/72; 438/151; 438/154

(58) Field of Classification Search
CPC ............ H01L 27/1214; H01L 29/4908; H01L 27/3244; H01L 27/3248; H01L 27/124; H01L 27/14603

USPC ............ 257/59, 72, E27.131, E27.132; 438/149, 151, 154; 349/43, 46

See application file for complete search history.

(56) References Cited

U.S. PATENT DOCUMENTS 7,102,164 B2     9/2006  Zhang
8,553,166 B2 *  10/2013  Liu .................................. 349/46
2006/0246360 A1 11/2006  Hwang

FOREIGN PATENT DOCUMENTS

KR   1020090044467 A   5/2009
KR   1020100132308 A  12/2010

\* cited by examiner

*Primary Examiner* — Minh-Loan T Tran
(74) *Attorney, Agent, or Firm* — Innovation Counsel LLP

(57) ABSTRACT

RC delay in gate lines of a wide display is reduced by using a low resistivity conductor in the gate lines and a different conductor for forming corresponding gate electrodes. More specifically, a corresponding display substrate includes a gate line made of a first gate line metal, a data line made of a first data line metal, a pixel transistor and a first connection providing part. The pixel transistor includes a first active pattern formed of polycrystalline silicon (poly-Si) and a first gate electrode formed there above and made of a conductive material different from the first gate line metal. The first connection providing part connects the first gate electrode to the gate line. On the other hand, the source electrode is integrally extended from the data line.

20 Claims, 11 Drawing Sheets

DISPLAY SUBSTRATE AND METHOD OF MANUFACTURING THE SAME

CROSS-REFERENCE TO RELATED APPLICATIONS

This application claims priority under 35 U.S.C. §119 to Korean Patent Application No. 10-2012-0023585, filed on Mar. 7, 2012 in the Korean Intellectual Property Office (KIPO), the contents of which application are herein incorporated by reference in their entirety.

BACKGROUND OF THE INVENTION

1. Technical Field

The present disclosure of invention relates to a display substrate and a method of manufacturing the display substrate. More particularly, the present disclosure of invention relates to a low temperature poly-silicon (LTPS) display substrate and a method of manufacturing the display substrate.

2. Discussion of Related Art

A display panel of a Liquid Crystal Display (LCD) or alike display device typically includes a transistor array substrate and a facing substrate facing the transistor array substrate with spacing there between often filled with a fluid such as a liquid crystal. The transistor array substrate typically includes a plurality of transistors used for example, for selectively addressing pixels and selectively altering their optical states. The transistor array substrate may also include circuit transistors monolithically integrated into the non-display or peripheral areas of the transistor array substrate.

Pixel addressing transistors such as those described above (often also referred to as the switching elements of the display device) may be classified into, for example, an amorphous-silicon (a-Si) type of TFT (thin film transistor), a polycrystalline silicon (poly-Si) type of TFT, etc., in accordance with characteristics of an active semiconductive pattern included in the transistor structure.

The poly-Si type of TFT typically has a higher electron mobility as compared to the a-Si type of TFT, so that it is possible to realize a desirable higher speed of driving for the corresponding display device. In contrast, the poly-Si type of TFT typically has a more complex manufacturing process than does the a-Si type of TFT so that manufacturing costs of the former tends to be higher than that of the a-Si type of TFT.

It may require high temperatures to form a poly-Si type active layer. Thus, the kinds of materials used for forming electrodes (e.g., gate electrode) of the poly-Si TFT may be limited.

On the other hand, nowadays, display devices are tending to become physically larger, higher resolutions are required, and thinner and longer signal lines are needed for applying gate driving signals or data driving signals to the pixels of the display. As a result RC delay becomes a problem.

In the past it was common to form the TFT gate electrode as an integral extension of the adjacent gate line. However, when the material used as the gate electrode of the poly-Si TFT is employed to also form the gate line, the resistance of the gate line may become excessively large and generate an unacceptable resistance-capacitance (RC) based delay for gate line signals.

It is to be understood that this background of the related technology section is intended to provide useful background for understanding the here disclosed technology and as such, the technology background section may include ideas, concepts or recognitions that were not part of what was known or appreciated by those skilled in the pertinent art prior to corresponding invention dates of subject matter disclosed herein.

SUMMARY

The present disclosure of invention provides a display substrate structured for reducing RC delay in its gate lines while enabling use of poly-Si type of TFTs.

Exemplary embodiments in accordance with the present disclosure of invention also provide a method of manufacturing the above-mentioned display substrate.

According to one aspect of the present disclosure, a display substrate includes a base substrate, a gate line, a data line, a pixel transistor and a first connection providing part. The gate line is extended in a first direction on the base substrate. The data line is extended in a second direction on the base substrate. The pixel transistor includes a first semiconductively active pattern, a first gate electrode, a source electrode and a drain electrode. The first active pattern includes polycrystalline silicon (poly-Si). The first gate electrode is spaced apart from the gate line and made of a metal different from that of the gate line. The source electrode is integrally extended from the data line. The drain electrode is spaced apart from the source electrode. The pixel electrode is electrically connected to the drain electrode. The first connection provided part electrically connects the gate line to the first gate electrode.

In an exemplary embodiment, the gate line may include a metal having a lower resistivity than that of the first gate electrode.

In an exemplary embodiment, the first connection providing part may include a first bridge conductor and a second bridge conductor. The first bridge conductor is integrally extended from the gate electrode. The second bridge conductor electrically connects the first bridge conductor to the gate line.

In an exemplary embodiment, the first bridge conductor may include a same material as used for the first gate electrode. The second bridge conductor may include a same material as used for the data line.

In an exemplary embodiment, the first gate electrode may include molybdenum (Mo), and the data line may include aluminum (Al).

In an exemplary embodiment, the display substrate may further include a first light-blocking pattern disposed below the first active pattern.

In an exemplary embodiment, the first light-blocking pattern may include a same material as used for the gate line.

In an exemplary embodiment, the gate line may include copper (Cu).

In an exemplary embodiment, the first active pattern may include a first source area doped with N type dopants at a relatively high concentration (N+) and a first drain area doped with N type dopants at a relatively high concentration. The source electrode makes contact with the first source area through a first contact hole, and the drain electrode makes contact with the first drain area through a second contact hole.

In an exemplary embodiment, the display substrate may further include a CMOS gates driving signal line, a first transistor, a second transistor (where the first and second transistors define a CMOS pair), a second connection providing part and a third connection providing part. The signal line is disposed on the base substrate to include a same material as that used for the gate line. The first transistor includes a second gate electrode spaced apart from the signal line and a poly-Si based second active layer disposed below the second gate electrode. The second active pattern includes a second source area doped with N type dopants at a high concentration and a second drain area doped with N type dopants at a high concentration. The second transistor includes a third gate electrode spaced apart from the signal line. The second transistor includes a respective third active pattern which is also a poly-Si based one that includes a third source area doped with N type dopants at a high concentration and a third drain area doped with N type dopants at a high concentration. The second connection providing part electrically connects the signal line to the first transistor. The third connection providing part electrically connects the signal line and the second transistor.

In an exemplary embodiment, the second connection providing part may include a third bridge conductor extended from the second gate electrode and a fourth bridge conductor electrically connecting the third bridge electrode to the signal line. The third connection providing part includes a fifth bridge conductor extended from the third gate electrode and a sixth bridge conductor electrically connecting the fifth bridge conductor to the signal line.

In an exemplary embodiment, the third and fifth bridge conductors may include a metal different from that of the signal line.

According to another aspect of the present disclosure of invention, there is provided a method of manufacturing a display substrate. In the method, a first gate metal pattern including a gate line extended in a first direction is formed on a base substrate. An active pattern including polycrystalline silicon (poly-Si) is formed on the base substrate on which the gate pattern is formed. A second gate metal pattern including a gate electrode spaced apart from the gate line is provided to include a material different from that of the gate line and a first bridge conductor is provided to integrally extend from the gate electrode toward a to be connected to portion of the gate line. A data metal pattern is formed, which includes a data line extended in a second direction, a source electrode integrally extended from the data line, a drain electrode spaced apart from the source electrode and a second bridge conductor electrically connecting the gate line and the first bridge conductor.

In an exemplary embodiment, when the first gate metal pattern is formed, a light-blocking pattern may be formed as part of the first gate metal pattern so as to be disposed below the active pattern for blocking light from an underlying backlighting unit from reaching the active pattern.

In an exemplary embodiment, the first gate metal pattern may have a lower resistivity than that of the second gate metal pattern.

In an exemplary embodiment, an insulative blocking layer may be further formed on the base substrate on which the first gate metal pattern is formed.

In an exemplary embodiment, the second bridge conductor may have a lower resistance than that of the first bridge conductor.

In an exemplary embodiment, the first bridge conductor may include molybdenum (Mo), and the second bridge conductor may include aluminum (Al).

In an exemplary embodiment, when the second gate metal pattern is formed, a gate metal layer and a photoresist layer may be sequentially formed on the base substrate on which the active pattern is formed. The photoresist layer may be patterned to form a photo masking pattern. The gate metal layer may be isotropically wet-etched by using the photo pattern as an etch mask.

In an exemplary embodiment, N type dopants may be doped into the active pattern by using the photo pattern as an implant mask. The photo pattern may then be removed. Further N type dopants may be doped into the active pattern at a lower concentration while using the gate electrode as an implant mask.

According to some exemplary embodiments, a first gate electrode includes a metal material different from a gate line metal so that a RC delay problem may be prevented or reduced although a display device is made larger in size.

The gate line includes a lower resistance material than that of the first gate electrode, so that a RC delay problem may be prevented or reduced although a display device is becoming larger.

A first light-blocking pattern is disposed below a first active pattern, so that it may prevent lights from being directly irradiated into the first active pattern. Thus, an off current of a pixel transistor may be decreased.

The first gate electrode includes molybdenum (Mo), so that the first active pattern may be heat treated (e.g., for crystallizing the semiconductive material of the active layer) without damaging the gate electrode. Thus, a display device may have an improved reliability.

BRIEF DESCRIPTION OF THE DRAWINGS

The above and other features and aspects of the present disclosure of invention will become more apparent by describing in detail, exemplary embodiments thereof with reference to the accompanying drawings, in which.

DETAILED DESCRIPTION

Hereinafter, the present disclosure of invention will be explained in detail with reference to the accompanying drawings.

Figure 1:
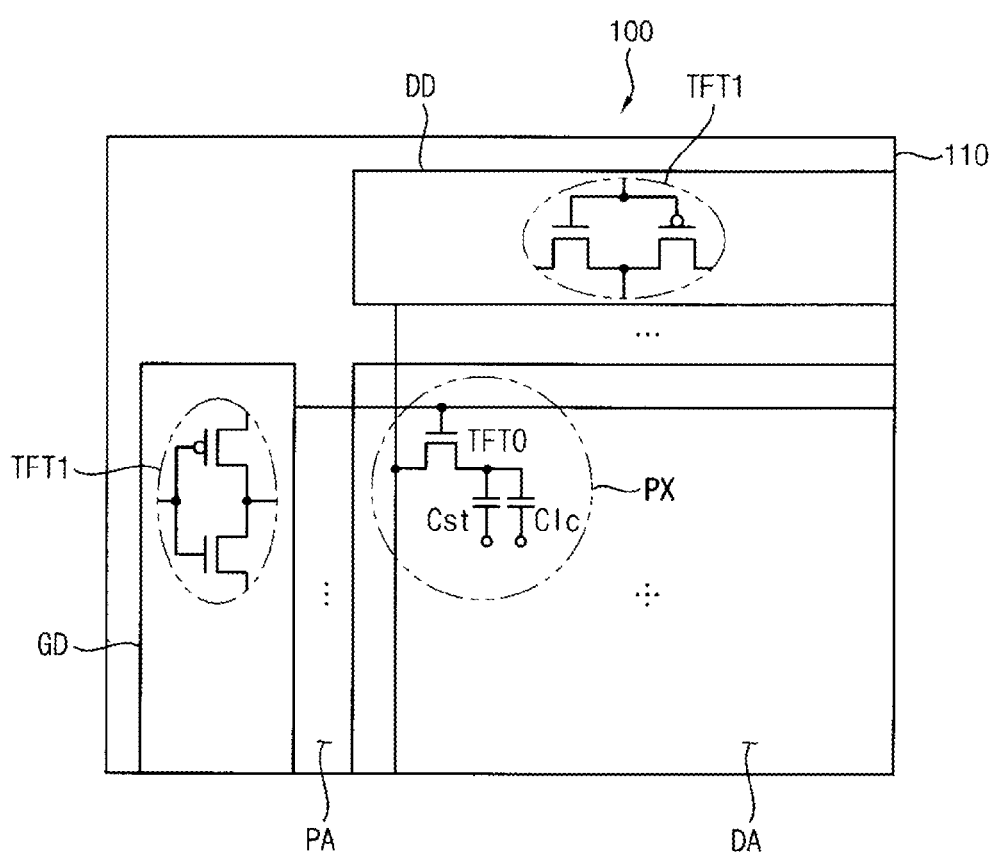
FIG. 1 is a plan schematic view illustrating a display substrate according to an exemplary embodiment in accordance with the present disclosure of invention.

FIG. 1 is a plan view schematically illustrating a display substrate 100 according to an exemplary embodiment of the present disclosure.

Referring to FIG. 1, the display substrate 100 is subdivided into a display area DA having pixels for displaying a desired image and into a peripheral area PA surrounding the display area DA and not having active pixels for displaying the desired image.

The display substrate 100 includes a base substrate 110 (see also FIGS. 3A-3B), a plurality of pixel parts PX disposed so as to populate the display area DA portion of the base substrate 110 and a plurality of driving parts (driving circuits, e.g., GD, DD) disposed in the peripheral area PA portions of the base substrate 110. While only one pixel part PX is shown in FIG. 1 for sake of illustrative clarity, it should be understood that a large number of such pixels area provided within the display area DA.

Each pixel part PX includes a respective pixel transistor TFT0. The pixel transistor TFT0 may be a NMOS transistor (an N-channel type of Metal/Oxide/Semiconductor transistor). The pixel part PX may further include capacitance type electrodes (e.g., pixel-electrode, storage electrode) respectively forming for example, a liquid crystal capacitor Clc and a storage capacitor Cst.

The driving parts include a gate-lines driving part GD and a data-lines driving part DD. The gate-lines driving part GD provides gate signals to corresponding gate lines extending horizontally across the display area DA. The data driving part DD provides data signals to corresponding data lines extending vertically across the display area DA.

The gate-lines driving part GD and the data-lines driving part DD may each include a respective and CMOS type circuit transistor structure TFT1. More specifically, the circuit transistor structure TFT1 is a Complementary MOS or CMOS transistors structure including a NMOS type of transistor and a PMOS type of transistor.

Figure 2A:
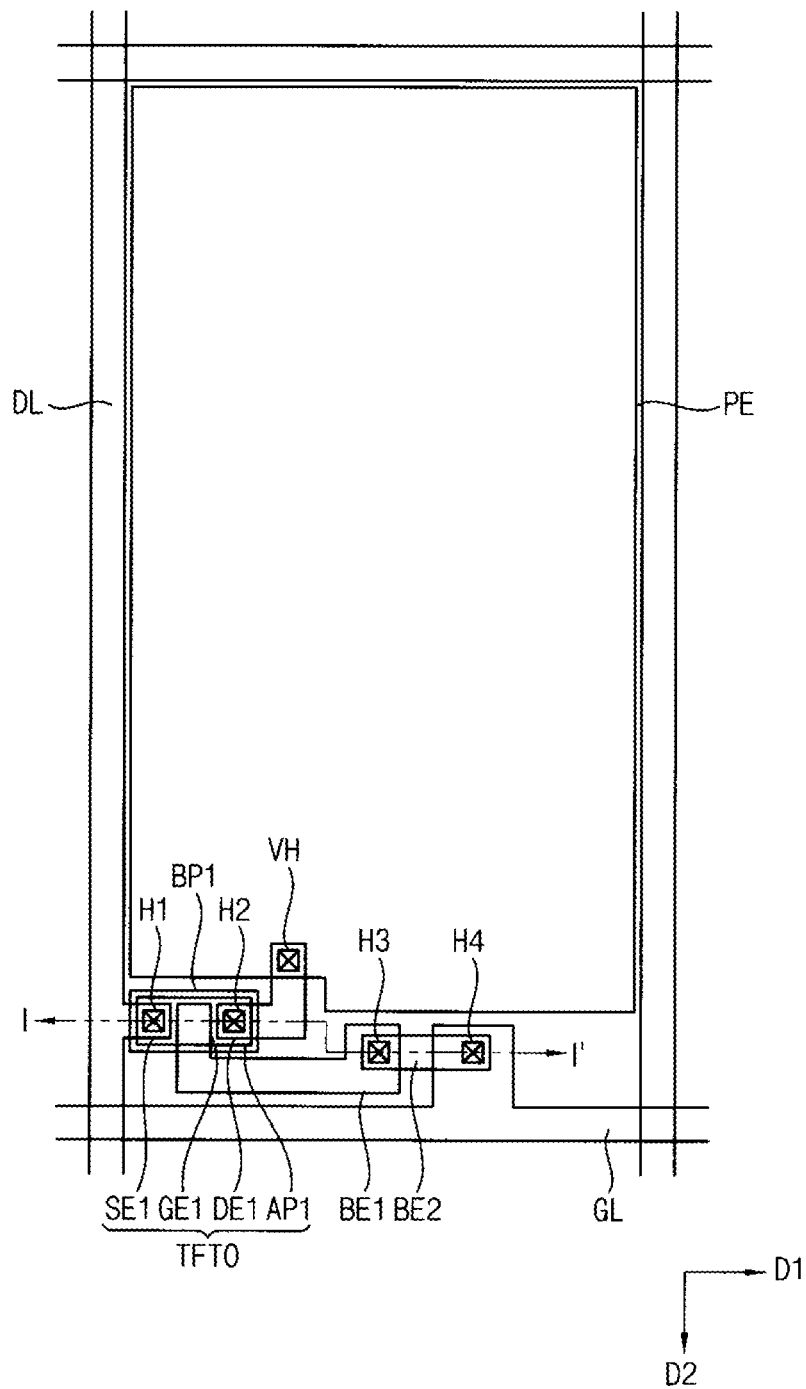
FIG. 2A is a top plan view illustrating a layout of a pixel part of FIG. 1.
Figure 2B:
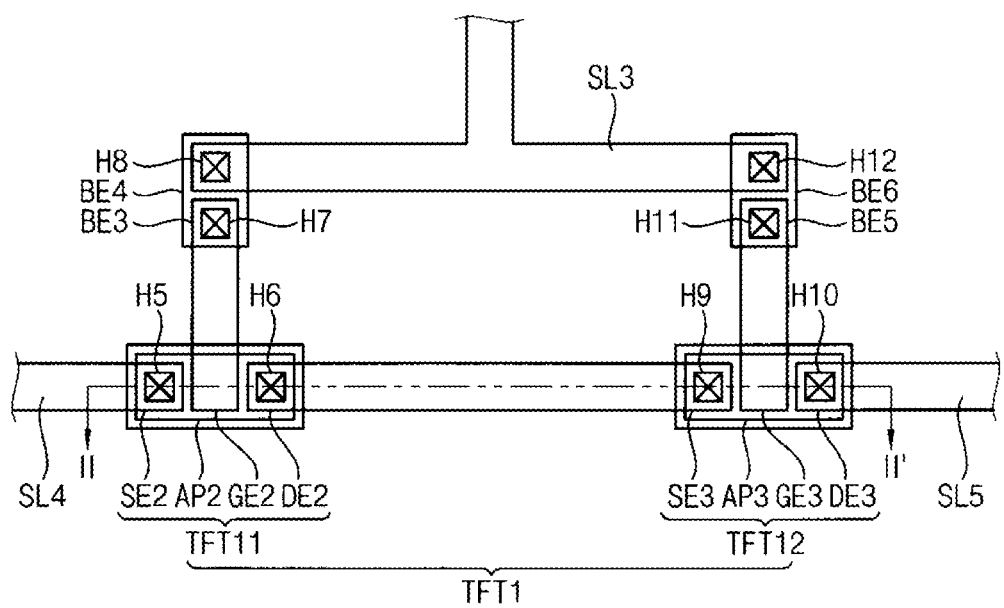
FIG. 2B is a top plan view illustrating in more detail a first circuit transistor structure (CMOS structure) within the structure of FIG. 1.
Figure 3A:
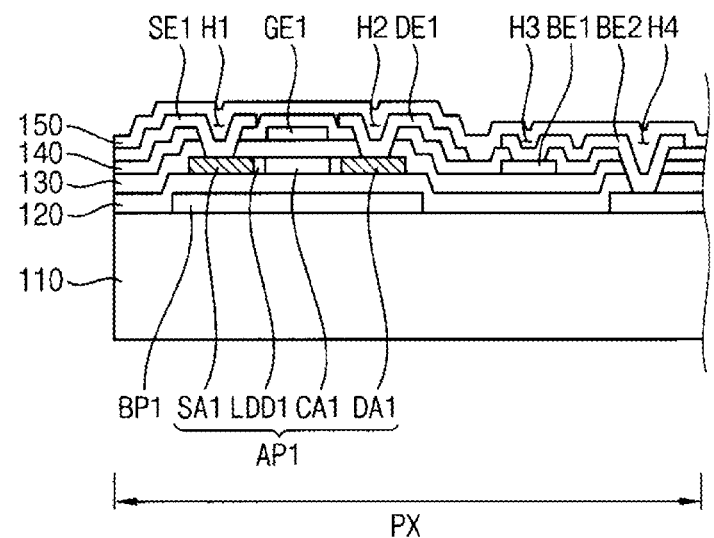
FIG. 3A is a cross-sectional view taken along a line I-I' of FIG. 2A.
Figure 3B:
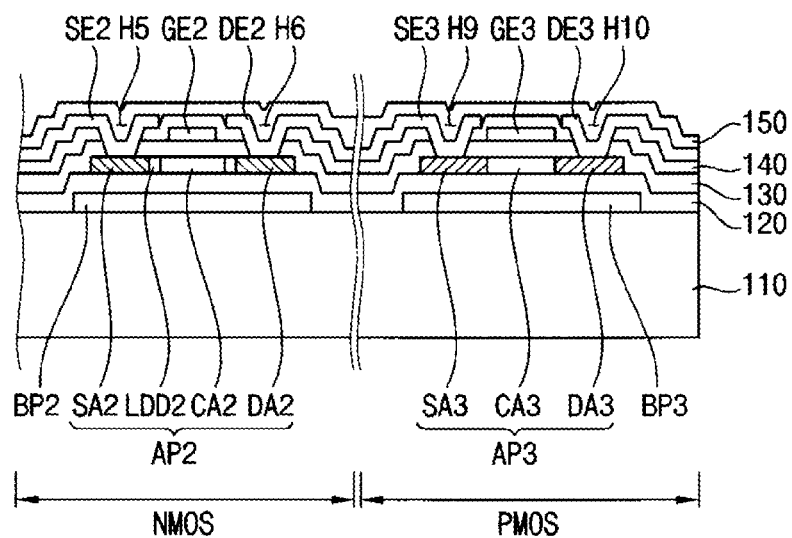
FIG. 3B is a cross-sectional view taken along a line II-II' of FIG. 2B.

FIG. 2A is a plan view illustrating a layout of a pixel part PX of FIG. 1. FIG. 2B is a plan view illustrating a layout of a first circuit transistor structure TFT1 of FIG. 1. FIG. 3A is a cross-sectional view taken along a line II' of FIG. 2A (of the pixel transistor TFT0 and further portions of the pixel part PX). FIG. 3B is a cross-sectional view taken along a line II-II' of FIG. 2B (of the CMOS transistors structure TFT1).

Referring to FIGS. 2A and 3A, each pixel part PX includes a gate line portion GL extending therethrough (also referred to here as a first signal line), a data line portion DL extending therethrough (also referred to here as a second signal line), a pixel transistor TFT0, a first connection part, a pixel electrode PE, a light-blocking pattern portion BP, a blocking layer 120, a first insulation layer 130, a second insulation layer 140 and a third insulation layer 150.

More specifically, the gate line portion GL is part of a gate line extended in a first direction D1. The data line portion DL is part of a data line extended in a second direction D2 different from the first direction D1.

The gate line portion GL may include a metal having a relatively superior thermal conductivity characteristic and a relatively low resistivity (good electrical conductivity).

The gate line and its portion GL includes a first metal layer having a low resistance. For example, the first metal layer may include at least one of copper (Cu) and/or a copper (Cu) alloy.

The gate line GL may further include a second metal layer disposed below the first metal layer. The second metal layer is disposed between the first metal layer and the base substrate 110 and acts as a migration barrier that prevents copper from the first metal layer from reaching and undesirably reacting with the base substrate 110. For example, the second metallic layer may include one selected from the group consisting of titanium (Ti), titanium nitride (TiN) and molybdenum (Mo). Herein the double stack of copper-based (Cu) metal on top and barrier metallic layer below will be referred to as the "Cu/2 stack".

The gate line GL is opaque and thus blocks light provided from an exterior side (e.g., from a backlighting unit) from leaking through areas not controlled by liquid crystal molecules, where this leakage prevention works to enhance a contrast ratio of the pixel parts PX of the display area DA.

The data line and its portion DL may include a metal capable of being selectively dry-etched and having a relatively low resistivity.

In one embodiment, the data line DL includes a third metal layer having a low resistivity. For example, the third metal layer may include at least one of aluminum (Al) and/or an aluminum (Al) alloy.

The data line DL may further include a fourth metal layer disposed below the third metal layer and a fifth metal layer disposed above the third metal layer. The fourth and fifth metal layers may function as migration barrier layers that prevent atoms of the third metal layer from migrating into and undesirably reacting with adjacent insulations. For example, each of the fourth and fifth metal layers may include one selected from the group consisting of titanium (Ti) and molybdenum (Mo). Herein the triple stack of aluminum-based (Al) metal in the middle and sandwiching top and bottom barrier metallic layers above and below will be referred to as the "Al/3 stack".

The pixel transistor TFT0 includes a first gate electrode GE1 and a first source electrode SE1, a first drain electrode DE1 and a first semiconductively active pattern AP1.

The first gate electrode GE1 is physically spaced apart from the gate line GL when viewed from a plan view of a display substrate and a cross-sectional view of a display substrate. The first gate electrode GE1 (as well as a corresponding first bridge electrode BE1) is made from a different conductive material than that (e.g., the Cu/2 stack) of the gate line GL. (Note the "bridge electrodes", BE's are also at times referred to herein as "bridge conductors".)

The first gate electrode GE1 is disposed over a channel portion CA1 of the first active pattern AP1. More specifically, the first gate electrode GE1 is capacitively coupled to the overlapped channel portion CA1 of the first active pattern AP1. As mentioned, the first gate electrode GE1 is not only spaced apart physically from the gate line GL1 but also includes a material different from that of the gate line GL1. The first gate electrode GE1 preferably includes a metal having superior characteristics relative to an in-fabrication process used heat-treatment (e.g., recrystallization, described below) and is capable of being selectively wet etched and selectively dry etched. More specifically, the first gate electrode GE1 should preferably include a material having a melting point higher than about 600° C. For example, the first gate electrode GE includes molybdenum (Mo) or molybdenum-titanium (MoTi). Alternatively, the first gate electrode GE1 may include a sixth metal layer including molybdenum (Mo) and a seventh metal layer including titanium (Ti).

The first source electrode SE1 is integrally extended from the data line DL and thus made of the same material (e.g., Al/3 stack) as that of the data line DL. The first source electrode SE1 is disposed over and makes electrical connection with a first source area portion SA1 of the first active pattern AP1. More specifically, the first source electrode SE1 is electrically connected to the first active pattern AP1 through a first contact hole H1 penetrating respective first and second insulation layers, 130 and 140.

The first drain electrode DE1 is spaced apart from the first source electrode SE1. The first drain electrode DE1 is disposed on the first active pattern AP1, and is overlapped with a first drain area DA1 of the first active pattern AP1 and is electrically connected to the first drain area DA1 of the first active pattern AP1 by way of a second contact hole H2 penetrating the first and second insulation layers, 130 and 140.

The first drain electrode DE1 includes a same material as that of the data line DL and the first source electrode SE1 (e.g., the Al/3 stack material).

Additionally, the first active pattern AP1 and its overlapping first gate electrode GE1, first source electrode SE1 and first drain electrode DE1 defines a NMOS type of TFT0 transistor. The first active pattern AP1 is physically spaced apart from the gate line GL when viewed from a top plan view of the display substrate as is shown in FIG. 2A.

In accordance with the present disclosure, the first active pattern AP1 includes a crystallized poly-silicon (poly-Si) material s its semiconductively active material. The first active pattern AP1 is selectively doped to include the aforementioned first channel area CA1, the first source area SA1 which is doped with N type dopants at a high concentration, the first drain area DA1 which is also doped with N type dopants at a high concentration (not necessarily same as the N+ concentration of SA1) and at least a first lightly doped area LDD1 which is doped with N type dopants at a low concentration (N−, where the latter is a substantially smaller concentration than the respective N+ concentration of SA1 and DA1).

Given that the first gate electrode GE1 is not an integral extension of the gate line GL, a bridging or first connection part is provided to connect the first gate electrode GE1 to the adjacent portion of the gate line GL. The first connection part includes a first bridge electrode BE1 and a second bridge electrode BE2.

The first bridge electrode BE1 is extended from the first gate electrode GE1 to a so-called, third contact hole H3 as best seen in FIG. 2A. The first bridge electrode BE1 includes a same material (e.g., the MoTi composition) as that of the first gate electrode GE1.

The second bridge electrode BE2 is connected to the first bridge electrode BE1 through the third contact hole H3 where the latter penetrates through the second insulation layer 140. The second bridge electrode BE2 is further connected to the gate line GL through a fourth contact hole H4 where the latter penetrates through a so-called, blocking layer 120, as well as through the first insulation layer 130 and the second insulation layer 140. That is, the gate line GL connects to the second bridge electrode BE2 (via H4), the second bridge electrode BE2 electrically connects to the first bridge electrode BE1 (via H3) and the first bridge electrode BE1 integrally connects to the first gate electrode GE1. As such, the first gate electrode GE1 is electrically connected to the gate line GL. The second bridge electrode BE2 includes a same material as that of the data line DL.

The first and second bridge electrodes, BE1 and BE2 provide a bridging connection between the first gate electrode GE1 and the adjacent portion of the first gate line GL1 which have different material compositions from each other. The conductive material of the gate line GL (e.g., the Cu/2 stack) helps to reduce the RC time constant of horizontally extending gate lines. In other words, although the form factor of display substrates like 100 is becoming larger, particularly in the horizontal direction (D1), the gate lines GL of embodiments in accordance with the present disclosure include a low resistance material (e.g., the Cu/2 stack) so that the RC delay problem may be solved or at least reduced. Moreover, the first gate electrode GE1 includes a superior material for a heat-treatment process, so that a reliability of a corresponding mass production manufacturing process may be enhanced.

The pixel electrode PE of FIG. 2A is electrically connected to the first drain electrode DE1 through a respective via hole VH penetrating the third insulation layer 150. The pixel electrode PE includes transparent conducting oxide (TCO). For example, the pixel electrode PE may include indium tin oxide (ITO), indium zinc oxide (IZO), etc.

The first light-blocking pattern BP1 is disposed below the first active pattern AP1 and includes a same material (e.g., Cu/2 stack) as the gate line GL. The first light-blocking pattern BP1 may serve several functions simultaneously including preventing backlighting lights from affecting the transistor functions of the first active pattern AP1 and helping to dissipate heat energy away from the pixel transistor TFT0. As such, an off current ($I_{DSoff}$) of a pixel transistor may be decreased.

Referring to FIGS. 2B and 3B, the CMOS driving parts of the array substrate may further include the illustrated circuit transistor structure TFT1, as well as a gate-driving third signal line SL3, a NMOS source/drain fourth signal line SL4, and a PMOS source/drain fifth signal line SL5. Additionally, the illustrated circuit transistor structure TFT1 may include: a second connection part, a third connection part, a second light-blocking pattern BP2 and a third light-blocking pattern BP3. The third, fourth and fifth signal lines (SL3, SL4, S15) are connected to the circuit transistor structure TFT1 as shown.

The circuit transistor structure TFT1 is a CMOS transistor structure which includes at least a first transistor TFT11 and an opposed second transistor TFT12. The first transistor TFT11 is a NMOS transistor, and the second transistor TFT12 is a PMOS transistor.

The first transistor TFT11 of the circuit transistor structure TFT1 includes a respective second gate electrode GE2, a second source electrode SE2, a second drain electrode DE2 and a second semiconductively active pattern AP2.

The second gate electrode GE2 is spaced apart from the third signal line SL3 when viewed from a plan view of a display substrate and a cross-sectional view of a display substrate.

The second gate electrode GE2 is disposed on the second active pattern AP2 in a manner corresponding to how the first gate electrode GE1 of FIG. 3A was described above as being disposed over and as being operatively coupled to its respective active pattern AP1. As such, the following descriptions will be slightly briefer in detail. The second gate electrode GE2 is overlapped with the second active pattern AP2. The second gate electrode GE2 includes a material different from the third signal line SL3. The third signal line SL3 includes a same material as the gate line GL. The second gate electrode GE2 includes a same material as the first gate electrode GE1.

The second source electrode SE2 is extended from the fourth signal line SL4. The second source electrode SE2 is disposed on the second active pattern AP2 to be overlapped with the second active pattern AP2. The second source electrode SE2 is electrically connected to the second active pattern AP2 through a fifth contact hole H5 penetrating the first and second insulation layers 130 and 140. The second source electrode SE2 makes contact with a second source area SA2 of the second active pattern AP2.

The second source electrode SE2 includes a same material as that of the first electrode SE1.

The second drain electrode DE2 is spaced apart from the second source electrode SE2. The second drain electrode DE2 is disposed on the second active pattern AP2, and is overlapped with the second active pattern AP2. The second drain electrode DE2 is electrically connected to the second active pattern AP2 through a sixth contact hole H6 penetrating the first and second insulation layers 130 and 140. The second drain electrode DE2 makes contact with a second drain area DA2 of the second active pattern AP2.

The second drain electrode DE2 includes a same material as that of the first drain electrode DE1.

The second active pattern AP2 is overlapped with the second gate electrode GE2, the second source electrode SE2 and the second drain electrode DE2. The second active pattern AP2 is spaced apart from the third signal line SL3 when viewed from a panel view of a display substrate.

The second active pattern AP2 includes a re-crystallized poly-silicon (poly-Si). The second active pattern AP2 includes a second channel area CA2, a second source area SA2 doped with N type dopants at a high concentration (N+), a second drain area DA2 doped with N type dopants at a high concentration (N+) and a second low concentration doped area LDD2 doped with N type dopants at a low concentration (N−).

A second connection part is provided and includes a third bridge electrode BE3 and a fourth bridge electrode BE4.

The third bridge electrode BE3 is extended from the second gate electrode GE2. The third bridge electrode BE3 includes a same material as that of the second gate electrode GE2.

The fourth bridge electrode BE4 is connected to the third bridge electrode BE3 through a seventh contact hole H7 penetrating the second insulation layer 140, and is connected to the third signal line SL3 through an eighth contact hole H8 penetrating the blocking layer 120, the first insulation layer 130 and the second insulation layer 140. That is, the fourth bridge electrode BE4 electrically connects to the third bridge electrode BE3 and the third signal line SL3. As such, the second gate electrode GE2 is electrically connected to the third signal line SL3. The fourth bridge electrode BE4 includes a same material as that of the data line DL.

The third and fourth bridge electrodes BE3 and BE4 connect to the second gate electrode GE2 and the third signal line SL3 which have the different materials from each other. Again, although display substrates such as 100 are tending to becoming physically larger, the third signal line SL3 includes a low resistance material so that a RC delay problem may be solved or reduced. Moreover, the second gate electrode GE2 includes a superior material for a heat-treatment process, so that a reliability of a corresponding mass production manufacturing process may be enhanced.

The second light-blocking pattern BP2 is disposed below the second active pattern AP2. The second light-blocking pattern BP2 includes a same material as that of the third signal line SL3. The second light-blocking pattern BP2 prevents light provided from an external portion from being undesirably provided to the second active pattern AP2. As such, an off current of the corresponding NMOS transistor may be decreased.

The second transistor TFT12 includes a third gate electrode GE3, a third source electrode SE3, a third drain electrode DE3 and a third active pattern AP3.

The third gate electrode GE3 is spaced apart from the gate-drive providing, third signal SL3 when viewed from a plan view of a display substrate and a cross-sectional view of a display substrate.

The third gate electrode GE3 is disposed on the third active pattern AP3. The third gate electrode GE3 is overlapped with the third active pattern AP3. The third gate electrode GE3 includes a material different from that of the third signal line SL3. The third gate electrode GE3 includes a same material as that of the first gate electrode GE1.

The third source electrode SE3 is extended from the second drain electrode DE2. The third source electrode is disposed on the third active pattern AP3 to overlap with the third active pattern AP3. The third source electrode SE3 is electrically connected to the third active pattern AP3 through a ninth contact hole H9 penetrating the first and second insulation layers 130 and 140. The third source electrode SE3 makes contact with a third source area SA3 of the third active pattern AP3.

The third source electrode SE3 includes a same material as that of the firth source electrode SE3.

The third drain electrode DE3 is spaced apart from the third source electrode SE3. The third drain electrode DE3 is disposed on the third active pattern AP3, and is overlapped with the third active pattern AP3. The third drain electrode DE3 is electrically connected to the third active pattern AP3 through a tenth contact hole H10 penetrating the first and second insulation layers 130 and 140. The third drain electrode DE3 is extended from the fifth signal line SL5. The third drain electrode DE3 makes contact with a third drain area DA3 of the third active pattern AP3.

The third drain electrode DE3 includes a same material as that of the first drain electrode DE1.

The third active pattern AP3 is overlapped with the third gate electrode GE3, the third source electrode SE3 and the third drain electrode DE3. The third active pattern AP3 is spaced apart from the third signal line SL3 when viewed from a plan view of a display substrate.

The third active pattern AP3 includes a re-crystallized poly-silicon (poly-Si). The third active pattern AP3 includes a third channel area CA3, a third source area SA3 doped with P type dopants at a high concentration (P+) and a third drain area DA3 doped with P type dopants at a high concentration (P+).

A third connection part is provided and it includes a fifth bridge electrode GE5 and a sixth bridge electrode BE6.

The fifth bridge electrode BE5 is extended from the third gate electrode GE3. The fifth bridge electrode BE5 includes a same material as that of the third gate electrode GE3.

The sixth bridge electrode BE6 is connected to the fifth bridge electrode BE5 through an eleventh contact hole H11 penetrating the second insulation layer 140, and is connected to the third signal line SL3 through a twelfth signal line SL3 through a twelfth contact hole H12 penetrating the blocking layer 120, the first insulation layer 130 and the second insulation layer 140. That is, the sixth bridge electrode BE6 electrically connects to the fifth bridge electrode BE5 and the third signal SL3. As such, the third gate electrode GE3 is electrically connected to the third signal line SL3. The sixth bridge electrode BE6 includes a same material as that of the data line DL.

The fifth and sixth bridge electrodes BE5 and BE6 connect to the third gate electrode GE3 and the third signal line SL3 which have the different materials from each other. Again, although the display substrates like 100 are tending to becoming larger, the third signal line SL3 includes a low resistance material so that a RC delay problem may be solved or reduced. Moreover, the third gate electrode GE3 includes a superior material for a heat-treatment process, so that a reliability of a corresponding mass production manufacturing process may be enhanced.

The third light-blocking pattern BP3 is disposed below the third active pattern AP3. The third light-blocking pattern BP3 includes a same material as that of the third signal line SL3. The third light-blocking pattern BP3 prevents light provided from an external portion from being provided to the third active pattern AP3. As such, an off current of the PMOS transistor may be decreased.

FIGS. 4A to 10B are cross-sectional view explaining a method of manufacturing the display substrate of FIG. 1. Particularly, FIGS. 4A, 5A, 6A, 7A, 8A, 9A and 10A are cross-sectional views explaining a method of manufacturing a pixel transistor such as that of FIG. 2B, and FIGS. 4B, 5B, 6B, 7B, 8B, 9B and 10B are cross-sectional views explaining a method of manufacturing a circuit transistor structure such as that of FIG. 2B.

Figure 4A:
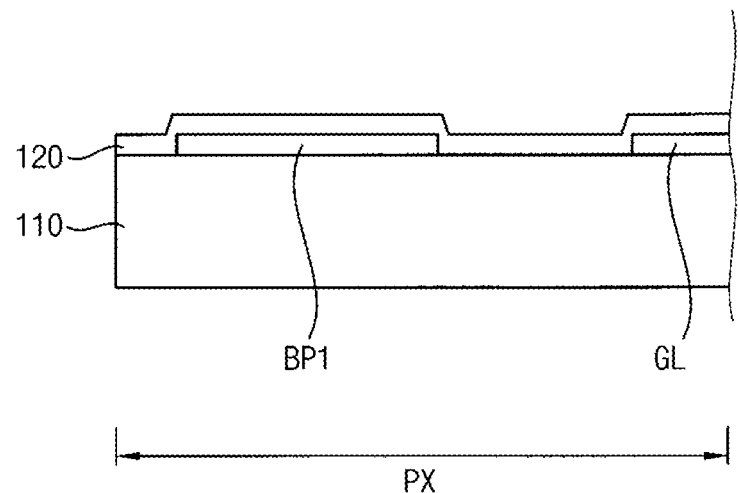
FIGS. 4A to 10B are cross-sectional views explaining a method of manufacturing a display substrate such as that of FIG. 1.
Figure 4B:
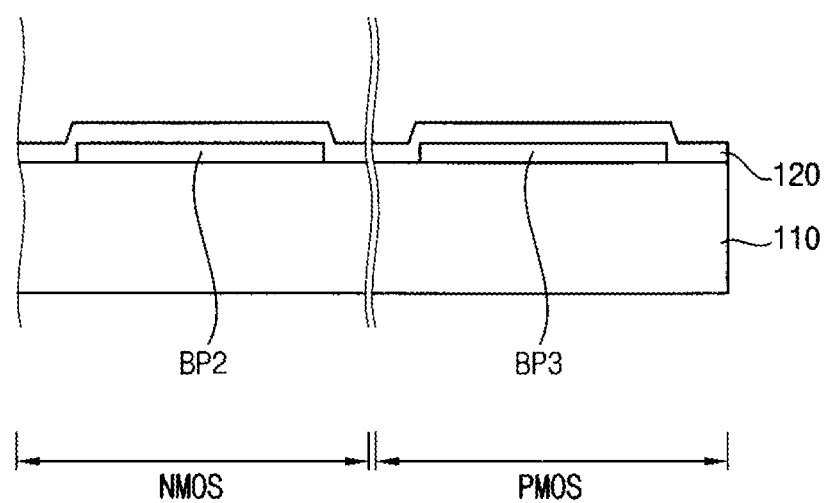

Referring to FIGS. 4A and 4B, a first gate metal layer is formed on the base substrate 110. The first gate metal layer is selectively patterned to form a first gate pattern including the gate line GL, the third signal line SL3 and the first, second and third light-blocking patterns BP1, BP2 and BP3. The gate line GL and the first light-blocking pattern BP1 are formed in the display area DA while the third signal line SL3 and the second and third light-blocking patterns BP2 and BP3 are formed in the peripheral area PA.

The first gate pattern includes a first metal layer having a relatively low resistance. As mentioned above, the first metal layer may include at least one of copper (Cu) and a copper (Cu) alloy. The first gate pattern may further include a second metal layer (copper barrier layer) disposed below the first metal layer. The second metal layer may include one selected from the group consisting of titanium (Ti), titanium nitride (TiN) and molybdenum (Mo). The second metal layer prevents that the first metal layer from reacting with the base substrate 110.

The blocking layer 120 is formed on the base substrate on which the first gate pattern is formed. The blocking layer 120 protects the first, second and third active patterns AP1, AP2 and AP3 from being shorted out by their respective and underlying light-blocking patterns BP1, BP2 and BP3. Additionally, the blocking layer 120 is formed of a material able to tolerate a silicon crystallizing anneal as shall be described later below. The blocking layer 120 may include at least one of a silicon nitride (SiNx) or a silicon oxide (SiOx), although other suitable blocking layer would also be within the scope of these embodiments.

Figure 5A:
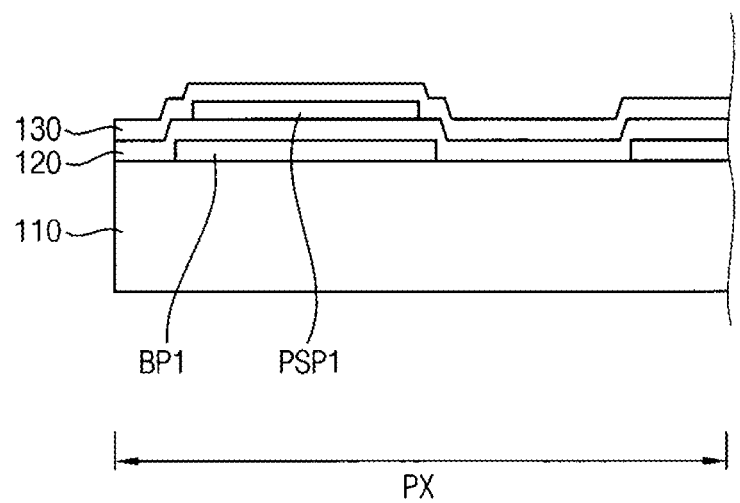
Figure 5B:
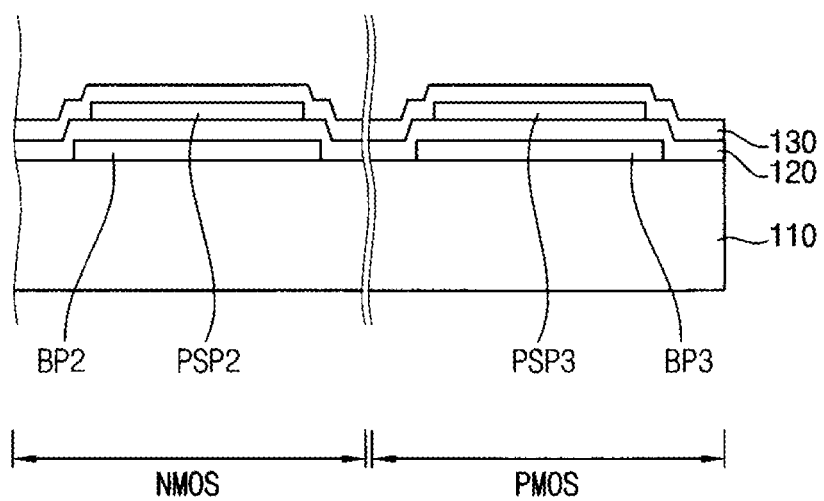

Referring to FIGS. 5A and 5B, an amorphous-silicon layer is next deposited or otherwise formed on the blocking layer 120. The amorphous-silicon layer is dehydrogenated, and then, after disposition on the blocking layer 120 is crystallized by for example using a laser to heat the amorphous-silicon material to a sufficiently high temperature so as to form a polycrystalline silicon layer at an upper surface portion of the initially deposited amorphous-silicon layer.

The crystallized poly-crystalline layer is then patterned to form corresponding first, second and third poly-crystalline silicon patterns PSP1, PSP2 and PSP3 as shown.

The first insulation layer 130 is then formed on the first, second and third poly-crystal silicon patterns PSP1, PSP2 and PSP3. The first insulation layer 130 may include a material having a superior interface characteristics for the first, second and third poly-crystalline silicon patterns PSP1, PSP2 and PSP3 since the interface between the respective gate electrodes and their channel portions will be formed at the opposed surfaces of the first insulation layer 130. The first insulation layer 130 may include a silicon oxide (SiOx) and/or a silicon nitride (SiOy). For example, the first insulation layer 130 may include a tetra ethyl ortho silicate (TEOS) for defining the gate insulation layer.

Figure 6A:
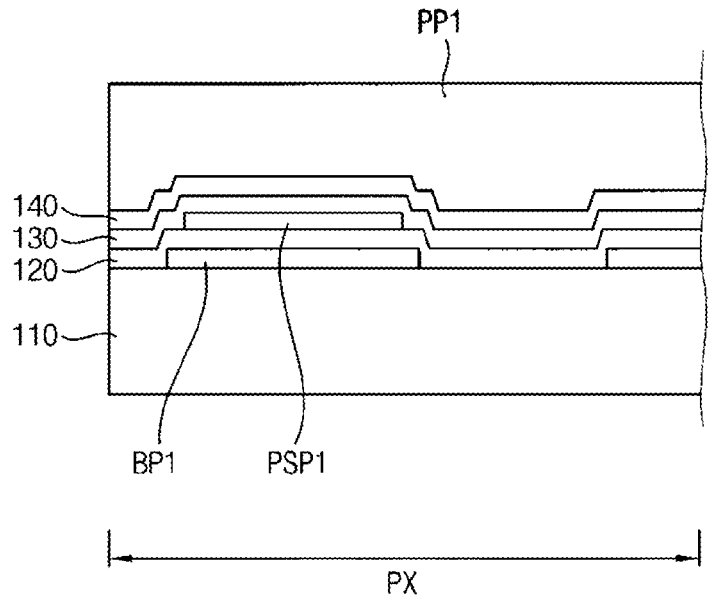
Figure 6B:
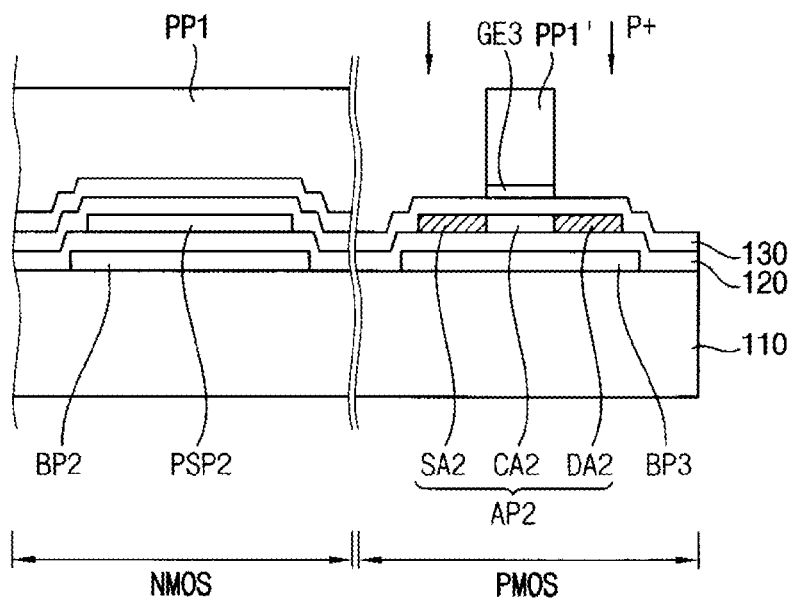

Referring to FIGS. 6A and 6B, a second gate metal layer 140 and a first photoresist layer PP1 are sequentially formed on the first insulation layer 130.

The first photoresist pattern is pattern by using a mask to form a first photo pattern PP1' as shown in FIG. 6B. The second gate metal layer is dry etched by using the first photo pattern PP1' to form a second gate pattern. The second gate pattern includes a third gate electrode GE3 of a second transistor TFT12 of the peripheral area PA and a fifth bridge electrode BE5 extended from the third gate electrode GE3.

For example, the first photo pattern PP1' is disposed on the second gate pattern of a PMOS area including the second transistor TFT12. Moreover, the first photo pattern PP1' is remaining on a remaining area (i.e., NMOS area) except the PMOS area.

Thus, the second gate pattern is formed on the PMOS areas, and the second gate metal layer is remaining unchanged in the NMOS area.

P dopants (e.g., boron (B) ions) are injected into the base substrate 100 on which the first photo pattern PP1' is formed at a high concentration (P+) to thereby form a third source area SA3 and a third drain area DA3 on the third poly-crystal silicon pattern PSP3. Thus, the third active pattern AP3 is formed, which includes the third channel area CA3, the third source area SA3 and the third drain area DA3.

Then, the first photopattern PP1' is removed.

Figure 7A:
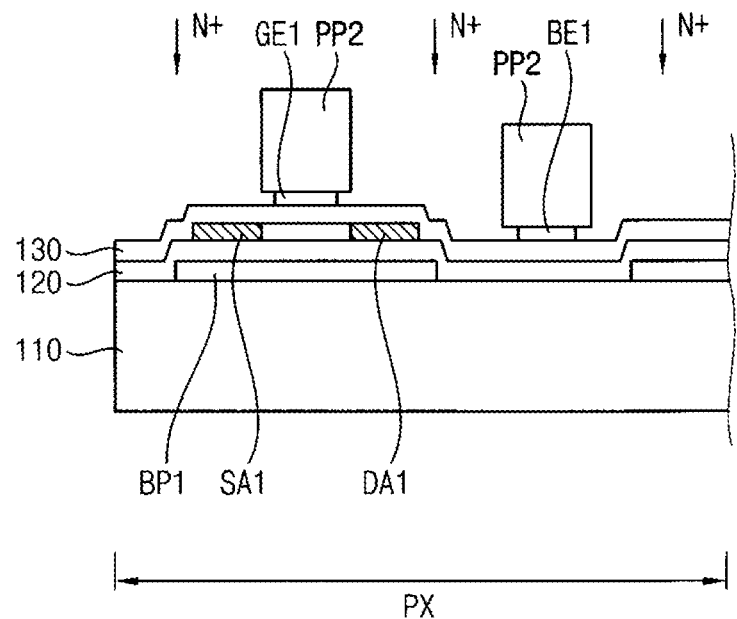
Figure 7B:
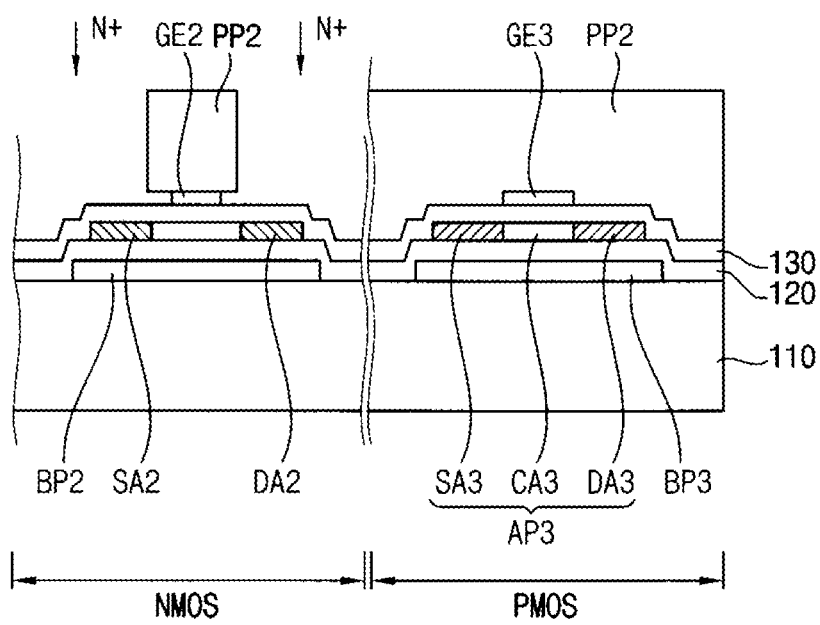

Referring to FIGS. 7A and 7B, a second photoresist layer PP2 (not shown) is formed on the base substrate 11 on which the third gate electrode GE3 is formed.

The second photoresist layer is patterned by using a mask to form a corresponding second photo pattern PP2'. The second gate metal layer is wet etched by using the second photo pattern PP2' to form a second gate pattern. The second gate pattern includes a first gate electrode GE1 of a pixel transistor TFT0 of the display area DA, a first bridge electrode BE1 extended from the first gate electrode GE1, a second gate electrode GE2 of a first transistor TFT11 of the peripheral area PA, and a third bridge electrode BE3 extended from the second gate electrode GE2.

For example, the second photo pattern PP2' is disposed on the second gate pattern of an NMOS area including the pixel transistor TFT0 and the first transistor TFT11. Moreover, the unpatterned second photo pattern PP2 is remaining unchanged on and thus protectively covering the PMOS area.

Referring to FIGS. 6A to 7B, the second gate metal layer may include a metal capable of being selectively patterned by wet etching and dry etching. For example, the second gate metal layer may include molybdenum (Mo) or molybdenum-titanium (MoTi). Alternatively, the second gate metal layer may include a multiplicity of conductive layers. As such, the first gate metal layer may include a sixth metal layer including molybdenum (Mo) and a seventh metal layer including titanium (Ti).

N dopants (i.e., phosphorus (P) ions) are injected into the first and second poly-crystal silicon patterns PSP1 and PSP2 by using a mask as the second photo pattern PP2' at a high concentration (N+) to form first and second source areas SA1 and SA2 and first and second drain areas DA1 and DA2.

In this case, an under cut is generated by an isotropic wet etch between the second photo pattern PP2' and the first and second gate electrodes GE1 and GE2 in accordance with isotropic wet etching characteristics. That is, a width of the second photo pattern PP2' may be greater than each width of the wet-etched first and second gate electrodes GE1 and GE2.

Then, the second photo pattern PP2' is removed.

Figure 8A:
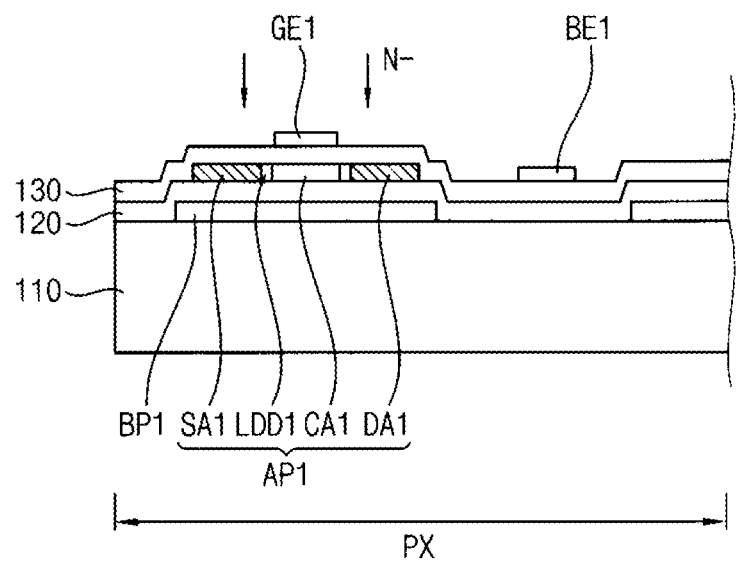
Figure 8B:
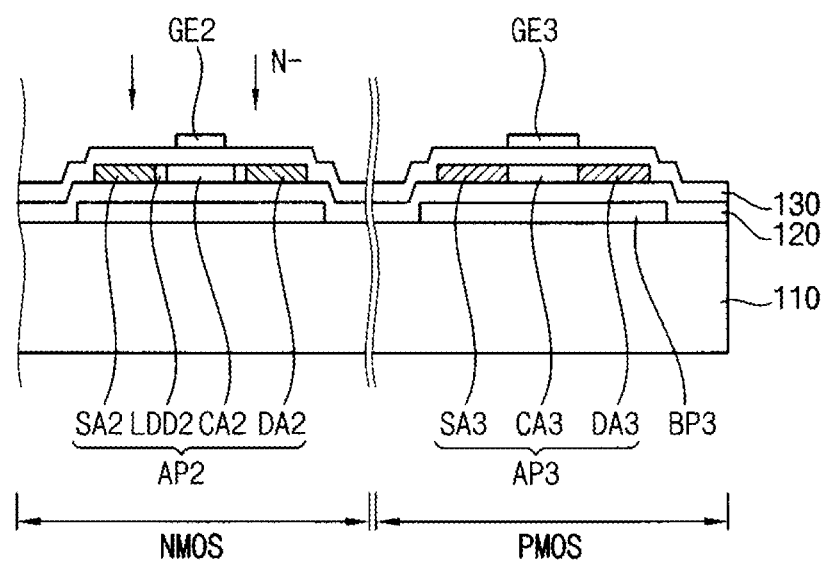

Referring to FIGS. 8A and 8B, N dopants (e.g., ions) are injected into the first and second poly-crystal silicon patterns PSP1 and PSP2 by using as a mask for this light doping step, the first and second gate electrodes GE1 and GE2 at a low concentration (N−) to thereby form first and second lightly doped areas LDD1 and LDD2.

Thus, the first active pattern AP1 is formed, which includes the first channel area CAL a first source area SA1, a first drain area DA1 and a first lightly doped area LDD1. Moreover, the second active pattern AP2 is formed, which includes the second channel area CA2, a second source area SA2, a second drain area DA2 and a second lightly doped area LDD2.

Then, the first, second and third active patterns AP1, AP2 and AP3 are activated (e.g., at least partially crystallized) by heat treating at this stage (after the gate electrodes have been patterned) by way of, for example, using an excimer laser, or furnace annealing, or a rapid thermal photo (RTP) annealing, etc.

Figure 9A:
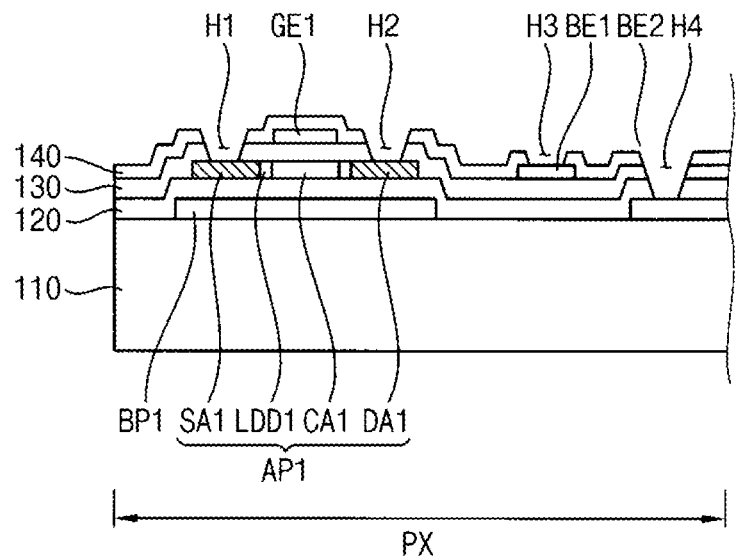
Figure 9B:
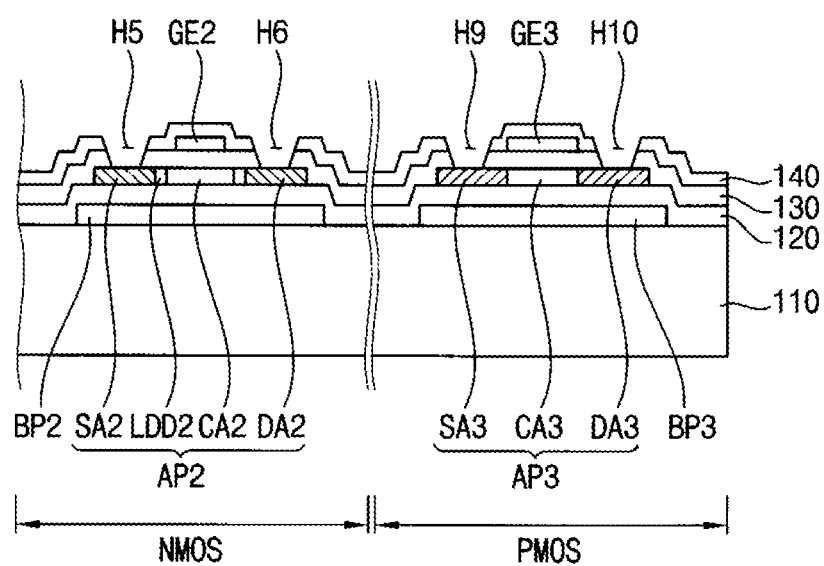

Referring to FIGS. 9A and 9B, a second insulation layer 140 is formed on the base substrate 110 on which the gate patterns are formed.

The second insulation layer 140 may include plural layers of insulative material. For example, the second insulation layer 140 may include a first layer including a silicon oxide (SiOx) and a second layer including a silicon nitride (SiNy). Here, the second layer may be formed on top of the first layer.

Then, the first and second insulation layers 130 and 140 are partially removed (e.g., selectively etched) to expose the first, second and third source areas SA1, SA2 and SA3 and the first, second and third drain areas DA1, DA2 and DA3. As such, a first contact hole H1, a second contact hole H2, a fifth contact hole H5, a sixth contact hole H6, a ninth contact hole H9 and a tenth contact hole H10 are formed therethough.

Moreover, the second insulation layer 140 is partially removed to expose the first, third and fifth bridge electrodes BE1, BE3 and BE5. As such, a third contact hole H3, a seventh contact hole H7 and an eleventh contact hole H11 are formed therethrough.

Moreover, the blocking layer 120, the first insulation layer 130 and the second insulation layer 140 are partially removed to expose the gate line GL and the third signal line SL3. As such, a fourth contact hole H4, an eighth contact hole H8 and a twelfth contact hole H12 are formed therethrough.

Figure 10A:
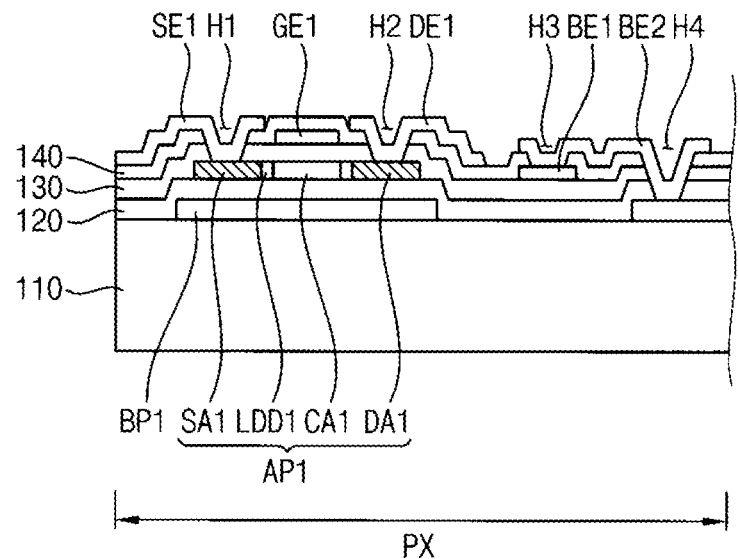
Figure 10B:
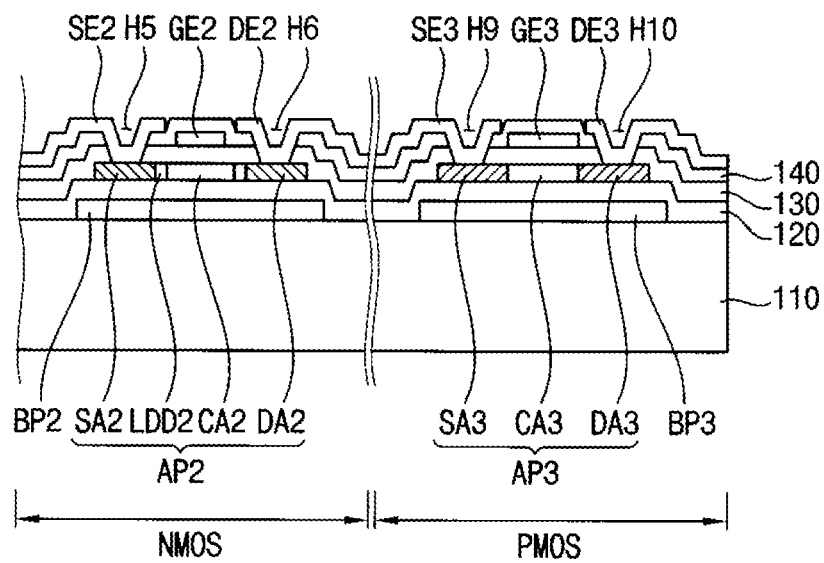

Referring to FIGS. 10A and 10B, a data lines metal layer is formed on the base substrate on which the first to eleventh contact holes H1, H2, H3, H4, H5, H6, H7, H8, H9, H10, H11 and H12 are formed.

The data metal layer is patterned to form a data wiring pattern. The data wiring pattern includes the data line DL, the first, second and third source electrodes SE1, SE2 and SE3, the first, second and third drain electrodes DE1, DE2 and DE3 and the second, fourth and sixth bridge electrodes BE2, BE4 and BE6.

That is, the first source electrode SE1 makes contact with a first source area SA1 of the first active pattern AP1 through the first contact hole H1, and the second source electrode SE2 makes contact with a second source area SA2 of the second active pattern AP2 through the fifth contact hole H5. The third source electrode SE3 makes contact with a third source area SA3 of the third active pattern AP3 through the ninth contact hole H9.

The first drain electrode DE1 makes contact with the first drain area DA1 of the first active pattern AP1 through the second contact hole H2, and the second drain electrode DE2 makes contact with a second drain area DA2 of the second active pattern AP2 through the sixth contact hole H6. The third drain electrode DE3 makes contact with a third drain area DA3 of the third active pattern AP3 through the tenth contact hole H10.

The second bridge electrode BE2 makes contact with the first bridge electrode BE1 and the gate line GL through the third and fourth contact holes H3 and H4, and the fourth bridge electrode BE4 makes contact with the third bridge electrode BE3 and the third signal line SL3 through the seventh and eighth contact holes H7 and H8. The sixth bridge electrode BE6 makes contract with the fifth bridge electrode BE5 and the third signal line SL3 through the eleventh and twelfth contact holes H11 and H12.

The data wiring pattern includes a third metal layer having a low resistance. For example, the third metal layer may include at least one of aluminum (Al) and an aluminum (Al) alloy. The data wiring pattern may further include a fourth metal layer disposed below the third metal layer and a fifth metal layer disposed on the third metal layer to thereby form the above mentioned Al/3 stack. For example, each of the fourth and fifth metal layers may include one selected from the group consisting of titanium (Ti) and molybdenum (Mo). The fourth and fifth metal layers may prevent that the third metal layer from reacting with adjacent silicon oxide (SiOx).

Referring again to FIGS. 2A to 3B, the third insulation layer 150 is formed on the base substrate 110 on which the data wiring pattern is formed.

The third insulation layer 150 is partially removed to expose the first drain electrode De1. As such, the via hole VH is formed.

Then, a pixel electrode PE electrically connected to the first drain electrode DE1 through the via hole VH is formed to form the display substrate 100.

According to the present exemplary embodiment, a first gate electrode includes a metal material different from a gate line, so that a RC delay problem may be prevented or reduced although the corresponding display device is made physically larger.

The gate line includes a low resistance material different from that of the first gate electrode, so that a RC delay problem may be prevented or reduced although a display device is becoming larger.

A first light-blocking pattern is disposed below a first active pattern, so that it may prevent lights from being directly irradiated into the first active pattern for example from an underlying backlighting unit. Thus, an off current of a pixel transistor may be decreased.

The first gate electrode includes molybdenum (Mo), so that the first active pattern may be heat treated to better crystallize its semiconductive material after the gate electrodes have been patterned. Thus, a display device may have an improved reliability.

The foregoing is illustrative of the present disclosure of invention and is not to be construed as limiting thereof Although a few exemplary embodiments in accordance with the present teachings have been described, those skilled in the art will readily appreciate from the foregoing that many modifications are possible in the exemplary embodiments without materially departing from the novel teachings and advantages of the present disclosure of invention. Accordingly, all such modifications are intended to be included within the scope of the present teachings. In the claims, means-plus-function clauses are intended to cover the structures described herein as performing the recited function and not only structural equivalents but also functionally equivalent structures. Therefore, it is to be understood that the foregoing is illustrative of the present teachings and is not to be construed as limited to the specific exemplary embodiments disclosed, and that modifications to the disclosed exemplary embodiments, as well as other exemplary embodiments, are intended to be included within the scope of the present teachings.

What is claimed is:

1. A display substrate comprising:
   a base substrate;
   a gate line longitudinally extended in a first direction on the base substrate, the gate line including a respective first gate line metal;
   a data line longitudinally extended in a second direction on the base substrate, the data line including a respective first data line metal;
   a pixel transistor comprising:
      a first active pattern comprising polycrystalline silicon (poly-Si);
      a first gate electrode disposed over and spaced apart from the first active pattern, the first gate electrode being spaced apart from the gate line and comprising a first gate electrode metal different from the first gate line metal of the gate line;

a source electrode integrally extended from the data line; and a drain electrode spaced apart from the source electrode;

a pixel electrode electrically connected to the drain electrode; and a first connection providing part electrically connecting the gate line to the spaced apart first gate electrode.

2. The display substrate of claim 1, wherein the first gate line metal of the gate has a lower resistivity than that of the gate electrode metal of the first gate electrode.

3. The display substrate of claim 1, wherein the first connection providing part comprises:

a first bridge conductor integrally extending from the gate electrode; and a second bridge conductor made of a conductive material different from that of the first bridge conductor and electrically connecting the first bridge electrode to the gate line.

4. The display substrate of claim 3, wherein the first bridge conductor includes the same first gate line metal as that of the first gate electrode, and the second bridge conductor includes the same first data line metal as that of the data line.

5. The display substrate of claim 4, wherein the first gate electrode metal comprises molybdenum (Mo), and the first data line metal comprises aluminum (Al).

6. The display substrate of claim 1, further comprising a first light-blocking pattern disposed below the first active pattern.

7. The display substrate of claim 6, wherein the first light-blocking pattern comprises the same first gate line metal as that of the gate line.

8. The display substrate of claim 7, wherein the first gate line metal of the gate line comprises copper (Cu).

9. The display substrate of claim 1, wherein the first active pattern comprises a first source area doped with N type dopants at a relatively high concentration for thereby providing N type charge carrier conductivity of a corresponding relatively high value in the first source area and a first drain area doped with N type dopants at a respective relatively high concentration for thereby providing N type charge carrier conductivity of a corresponding relatively high value in the first drain area, the source electrode makes contact with the first source area through a first contact hole, and the drain electrode makes contact with the first drain area through a second contact hole.

10. The display substrate of claim 1, further comprising:

a first signal line disposed on the base substrate and comprising same conductive materials as those of the gate line;

a first transistor comprising a second gate electrode spaced apart from the first signal line and having poly-Si forming a second active pattern disposed below the second gate electrode, wherein the second active pattern comprises a second source area doped with N type dopants at a high concentration and a second drain area doped with N type dopants at a high concentration;

a second transistor comprising a third gate electrode spaced apart from the first signal line and having poly-Si disposed forming a third active pattern below the third gate electrode, wherein the third active pattern comprises a third source area doped with N type dopants at a high concentration and a third drain area doped with N type dopants at a high concentration;

a second connection providing part electrically connecting the first signal line to the first transistor; and a third connection providing part electrically connecting the first signal line to the second transistor.

11. The display substrate of claim 10, wherein the second connection providing part comprises a third bridge conductor extended from the second gate electrode and a fourth bridge conductor electrically connecting the third bridge conductor to the first signal line, and the third connection providing part comprises a fifth bridge conductor extended from the third gate electrode and a sixth bridge conductor electrically connecting the fifth bridge conductor to the first signal line.

12. The display substrate of claim 11, wherein the third and fifth bridge conductors comprise a metal different from that of the first signal line.

13. A method of manufacturing a display substrate, the method comprising:

forming a first gate pattern comprising a gate line extended in a first direction on a base substrate;

forming a semiconductively active pattern comprising polycrystalline silicon (poly-Si) on the base substrate on which the gate pattern is formed;

forming a second gate pattern comprising a gate electrode spaced apart from the gate line and comprising a material different from that of the gate line and a first bridge conductor extended from the gate electrode; and forming a data wiring pattern comprising a data line extended in a second direction, a source electrode extended from the data line, a drain electrode spaced apart from the source electrode and a second bridge conductor electrically connecting the gate line to the first bridge conductor.

14. The method of claim 13, wherein forming the first gate pattern further comprises forming a light-blocking pattern below the active pattern.

15. The method of claim 14, wherein the first gate pattern has a lower resistivity than that of the second gate pattern.

16. The method of claim 13, further comprising:

forming an insulative blocking layer on the base substrate on which the first gate pattern is formed.

17. The method of claim 13, wherein the second bridge conductor has a lower resistivity than that of the first bridge conductor.

18. The method of claim 13, wherein the first bridge conductor comprises molybdenum (Mo), and the second bridge conductor comprises aluminum (Al).

19. The method of claim 13, wherein forming the second gate pattern comprises:

sequentially forming a gate metal layer and a photoresist layer on the base substrate on which the active pattern is formed;

patterning the photoresist layer to form a photo pattern; and wet-etching the gate metal layer using the photo pattern as an etch mask.

20. The method of claim 19, further comprising:

doping N type dopants a first time into the active pattern by using the photo pattern as an implant mask;

removing the photo pattern; and doping N type dopants a second time into the active pattern by using the gate electrode as an implant mask.

* * * * *